(12) United States Patent
Chandhok et al.

(10) Patent No.: US 7,459,260 B2
(45) Date of Patent: Dec. 2, 2008

(54) METHOD OF REDUCING SENSITIVITY OF EUV PHOTORESISTS TO OUT-OF-BAND RADIATION AND EUV PHOTORESISTS FORMED ACCORDING TO THE METHOD

(75) Inventors: Manish Chandhok, Beaverton, OR (US); Wang Yueh, Portland, OR (US); Heidi Cao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 127 days.

(21) Appl. No.: 11/093,889

(22) Filed: Mar. 29, 2005

(65) Prior Publication Data

US 2006/0223000 A1  Oct. 5, 2006

(51) Int. Cl.
*G03F 7/004* (2006.01)
*G03F 7/039* (2006.01)

(52) U.S. Cl. .................................. 430/270.1

(58) Field of Classification Search ............. None
See application file for complete search history.

(56) References Cited

U.S. PATENT DOCUMENTS

| | | | |
|---|---|---|---|
| 6,656,660 B1 * | 12/2003 | Urano et al. | 430/270.1 |
| 2002/0021425 A1 * | 2/2002 | Janssen et al. | 355/53 |
| 2005/0053861 A1 * | 3/2005 | Yoneda et al. | 430/270.1 |

OTHER PUBLICATIONS

William Reusch, Visible and Ultraviolet Spectroscopy, May 10, 2004 http://www.cem.msu.edu/~reusch/VirtualText/Spectrpy/UV-Vis/spectrum.htm.

* cited by examiner

*Primary Examiner*—Cynthia Hamilton
(74) *Attorney, Agent, or Firm*—Scott M. Lane; Intel Corporation

(57) ABSTRACT

A modified EUV photoresist and a method of making the resist. The modified resist includes an EUV photoresist and a LAM incorporated into the EUV photoresist.

27 Claims, 3 Drawing Sheets

6,13-pentacenequinone

METHOD OF REDUCING SENSITIVITY OF EUV PHOTORESISTS TO OUT-OF-BAND RADIATION AND EUV PHOTORESISTS FORMED ACCORDING TO THE METHOD

FIELD

Embodiments of the present invention relate generally to the manufacture of semiconductor integrated circuits and, particularly, to photolithography processes for manufacturing such circuits.

BACKGROUND

In the manufacture of semiconductor integrated circuits, a photoresist film is formed over a semiconductor wafer. The photoresist film may be irradiated so that some regions of the photoresist film are either harder or easier to dissolve in aqueous base developer. As a result, a pattern can be repeatedly transferred to the semiconductor wafer via the photoresist film. After developing, the photoresist film may be used as a mask for etching desired features in the underlying layers of the semiconductor wafer.

Advances in photolithography techniques utilized to transfer patterns to photoresist have enabled increasingly smaller patterns to be transferred. As a result, smaller integrated circuit features can be formed in integrated circuits. Thus, more elements can be put in a given area on a semiconductor integrated circuit. One result of these advances has been to reduce the cost of integrated circuits.

One advanced photolithography technology is extreme ultraviolet technology (EUV). EUV uses short wavelength radiation, typically in the spectral region between about 1 nm to about 40 nm, in order to carry out projection imaging. Currently, most EUV work is carried out in a wavelength region of about 13.5 nm. However, as a result of the plasmas used to produce EUV, there is a large component of the radiation that is "out-of-band," that is, there is a large component of the radiation that has a wavelength different from the target wavelength of the EUV source (typically about 13.5 nm, +/− about 0.05 nm). The optics in an EUV system tend to exhibit chromatic aberrations, which are wavelength dependent. As a result, it is desirable to tightly control the wavelength range of the source in an EUV system.

FIG. 1 provides a graph of a sample spectral output of a typical EUV source, and plots intensity of light in a.u. ("arbitrary units") versus radiation wavelength in nanometers. As seen in FIG. 1, there is a non-negligible fraction of EUV radiation that can be out-of-band. EUV photoresists are not only sensitive to EUV radiation, but also to out-of-band radiation, and, especially to deep ultraviolet (DUV) radiation with a wavelength between about 200 nm and about 300 nm, and usually at about 248 nm. Thus, although all out-of-band radiation may be problematic, DUV out-of-band radiation is particularly problematic since EUV photoresists are sensitive to DUV light. Exposure of the EUV photoresist to out-of-band radiation typically results in unwanted background exposure of the resist called "flare." Flare among other things hurts the resolution of the resist, reducing contrast with respect to unexposed areas, and compromising the ability to etch patterns of sufficiently small sizes.

As is well known, EUV imaging systems are entirely reflective systems that function based on mirrors or reflecting surfaces coated with multilayer thin films (ML's), typically Mo and Si, sometimes capped with Ru, although other materials may be used for multilayer thin films and for the capping layer. The ML's in an EUV imaging system do not mitigate the problems caused by out-of-band radiation. ML's used in EUV lithography reflect out-of-band radiation in the DUV range almost as well as radiation in the EUV range. Thus, out-of-band radiation is in no way attenuated by the presence of the ML's.

To prevent DUV radiation from reaching the wafer being etched using EUV lithography, the prior art proposes the use of an optical element typically referred to as a "Spectral Purity Filter" (SPF). An SPF transmits EUV light but blocks out-of-band radiation, specifically DUV light. However, to the extent that all materials tend to absorb EUV, the presence of the SPF is expected to result in a reduction of the EUV radiation reaching the wafer by about 50%, disadvantageously reducing a throughput of the system and possibly requiring higher power sources, either of which would drive up the cost of ownership with respect to EUV lithography.

Prior art methods of alleviating problems associated with flare in EUV systems disadvantageously reach their goal only by compromising the throughput of the system as a whole.

BRIEF DESCRIPTION OF THE DRAWINGS

Embodiments of the invention are illustrated by way of example and not by way of limitation in the figures of the accompanying drawings, in which the like references indicate similar elements and in which.

DETAILED DESCRIPTION

A modified EUV photoresist and a method of making the resist are described herein. The modified resist includes an EUV photoresist and a LAM incorporated therein, such as by blending.

Various aspects of the illustrative embodiments will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding embodiments of the present invention, however, the order of description should not be construed as to imply that these operations are necessarily order dependent. In particular, these operations need not be performed in the order of presentation.

The phrase "in one embodiment" used herein generally does not refer to the same embodiment, however, it may. The terms "comprising", "having" and "including" are synonymous, unless the context dictates otherwise. In addition, the words "photoresist" and "resist" are used interchangeably in the instant description.

Figure 2A:
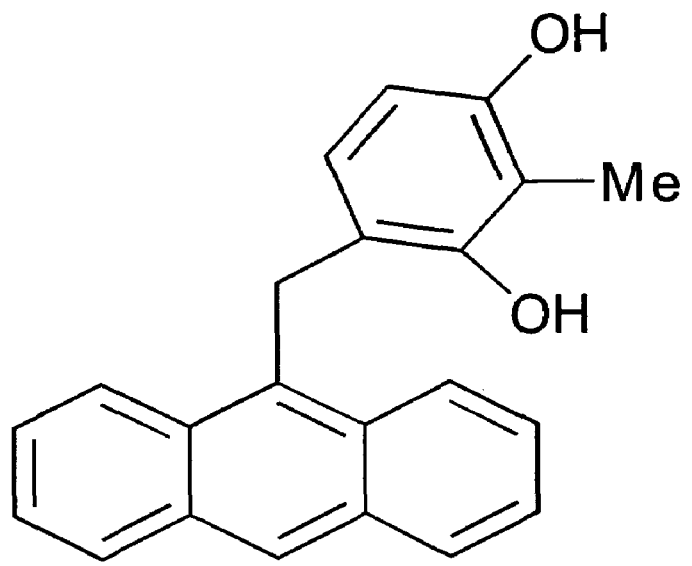
FIGS. 2A and 2B depict molecules of two different light absorbance materials adapted to be incorporated into an EUV photoresist according to embodiments of the present invention.
Figure 2B:
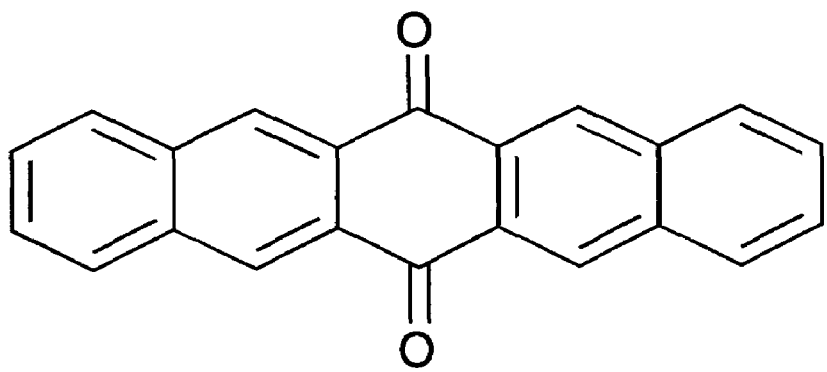

According to one embodiment, by introducing a light absorbance material (LAM) into an EUV photoresist, such as a chemically amplified EUV photoresist developable in an aqueous base solution, the sensitivity of the photoresist to out-of-band radiation, and especially to DUV radiation, may be reduced. Unless noted otherwise, by "sensitivity of the photoresist" or "sensitivity of the resist," what is meant in the context of the present invention is the sensitivity of the bulk of the resist, otherwise referred to as "bulk sensitivity." For example, according to embodiments of the present invention, the addition of a LAM to an EUV photoresist may reduce a bulk sensitivity of the resist to DUV radiation by about 90% to about 100%. A reduction in sensitivity as noted above may be brought about, at least in part, by an absorption of a majority of the out-of-band radiation (such as DUV radiation with a wavelength between about 200 nm and about 300 nm) in the top few nanometers of the resist, such that, in the bulk of the resist, the sensitivity to out-of-band radiation may be small, less than about 10%, and preferably less than about 5% of a sensitivity of the original (unmodified) resist, that is, of the resist prior to LAM addition. A depth of absorption of the out-of-band radiation is typically a function of an amount of LAM incorporated into the resist materials. According to embodiments of the present invention, a molar percentage of the amount of LAM incorporated into the resist materials may for example be between about 5% and about 15% after spinning of the resist and solvent evaporation, or between about 0.01% to a about 1.0% before solvent evaporation. Higher molar percentages may interfere with the formation of a homogeneous mixture of the LAM and resist materials. Generally, in the modified resist according to embodiments of the present invention, the molar percentage of the resist materials themselves should predominate in order to ensure an effective solubility switch between exposed and unexposed areas of the resist. The addition of a LAM to an EUV photoresist advantageously leads to a modified EUV photoresist according to embodiments of the present invention that provides efficient absorption of out-of-band radiation at higher wavelengths within the top few nanometers of the resist, thus substantially obviating problems typically associated with flare. LAMs, may include, for example, functionalized anthracene as shown in FIG. 2A, or 6,13-pentacenequinone as shown in FIG. 2B. LAMs may, according to embodiments of the present invention, have a conjugated aromatic structure, as shown by way of example in FIGS. 2A and 2B, which would, additionally, advantageously improve an etch resistance of an EUV photoresist incorporating such a LAM.

Advantageously, the LAMs according to embodiments of the present invention may be selected as a function of the EUV resist among others such that the absorbance properties of the EUV resist will not increase by the addition or the LAM. Typically, a LAM according to embodiments of the present invention should exhibit high DUV absorbance, that is, a DUV absorbance larger than about 2 $\mu m^{-1}$ and low EUV absorbance, that is, EUV absorbance less than about 1 $\mu m^{-1}$. Absorbance In DUV is dominated by bond structure. Thus, relatively small amounts of bulky aromatics will tend to cause relatively large changes in DUV absorbance. For EUV, on the other hand, the absorbance of the resist is dominated by the composition of the resist. However, since, according to embodiments of the present invention, the LAM may be present in the resist film at a concentration of only about 5% to about 10%, the composition of the LAM should not have a significant impact on EUV absorbance. The above notwithstanding preferred embodiments of the present invention have as one of their aims a minimization of EUV absorbance. For example, according to embodiments of the present invention, LAMs with an oxygen content not higher than an oxygen content of the polymer resin of the photoresist, that is, a maximum oxygen content of about 25%, may be used to minimize EUV absorbance. Another way of minimizing EUV absorbance according to embodiments of the present invention would be to uses LAMs containing silicon, hydrogen or carbon that tend to reduce EUV absorbance. Reducing absorbance to EUV would likely improve performance by yielding sidewall angles of patterned features in the photoresist which are closer to being vertical, and further by allowing more of the incident light to reach the bottom of the resist, thus improving resolution. The LAMs according to embodiments of the present invention are thus selected such that either: (1) the elements making up the LAMs that tend to increase absorbance with respect to EUV radiation are at the same or at a lower concentration as those in the EUV resist so that there is no net increase in absorbance with respect to EUV radiation when a LAM is incorporated therein; or (2) the elements in the LAM (such as, for example, Si) have a lower absorbance than elements In the EUV resist. For example, the elemental composition of the LAMs depicted in FIGS. 2A and 2B includes oxygen. Hydrophilic oxygen groups in LAMs may be needed to improve the solubility of the LAMs in EUV photoresists. Oxygen, however, is also an element that increases absorbance with respect to EUV radiation. However, to the extent that all of the components in currently existing EUV resists contain some oxygen, the absorbance of the resists into which any one of the LAMs of FIGS. 2A and 2B are incorporated will not be increased.

Figure 3:
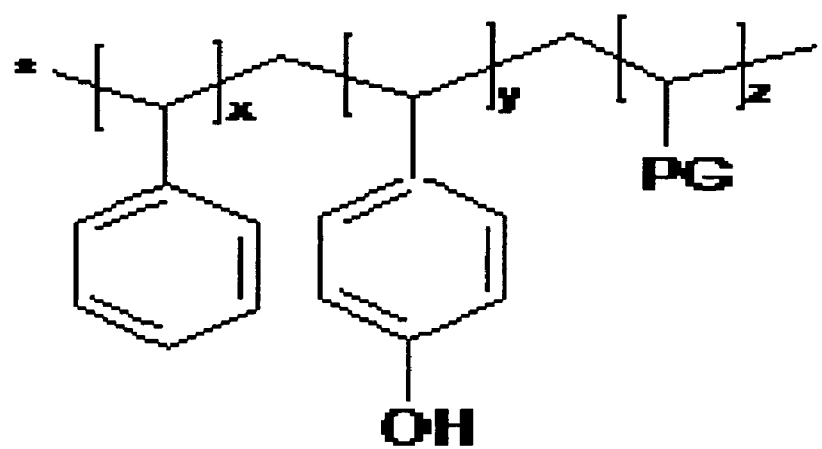
FIG. 3 depicts an exemplary molecule of a photoacid generator adapted to be used as part of an EUV photoresist according to embodiments of the present invention.

A mechanism by which LAM addition to an EUV photoresist substantially eliminates flare caused by out-of-band radiation is described below. It is known that current chemically amplified photoresists contain photoacid generators (PAG's), which are components in the resist formulation that generate acids upon exposure to appropriate radiation. During the postexpose bake process (PEB), the generated acids will cleave the protecting groups on the photoresist resins and switch the photoresist's solubility in a mildly basic aqueous developer. PAGs fall into two categories, ionic and non-ionic. Ionic PAGs will have iodonium or sulfonium cations. Typically, for DUV and EUV, ionic PAGs will be phenyl based, but other alkyl groups may be substituted, especially in 193 nm lithography. Anions (for ionic PAGs) are typically sulfonate based, and the PFAS described above are common for 248 nm and 193 nm lithography. For EUV, the PFAS may be less desirable due to their high fluorine content. Non-ionic PAGs typically include sulfonate types of materials. An example of a PAG is provided in FIG. 3. As shown, the deblocking or protecting group PG can include t-Boc, an ester group, a cage group, or a ketal (actal) group, to name just a few, with x between about 30% and about 60%; y between about 5% and about 30%; and z between about 5% and about 30%. Examples of PAGs include perfluorooctane sulfonate (PFOS) and perfluoroalkyl sulfonate (PFAS) anion and phenyl-based cation photoacid generators.

The mechanism by which an acid is generated from a PAG is different in EUV lithography when compared with DUV lithography. EUV radiation at about 13.5 nm (about 93 eV) is absorbed by the polymer backbone of the resist, creating a cation radical. PAGs scavenge the scattered electrons to produce an acid. DUV radiation at about 248 nm (about 5 eV) on the other hand directly interacts with the bonds in the PAG to produce the acid. It is noted that, although the above represents the generally accepted mechanism of acid generation by virtue of a PAG, there is limited data on the mechanism by which an acid is generated in EUV. Nevertheless, the sensitivity of EUV resists to DUV radiation is on the same order of magnitude as to EUV radiation. Since the addition of LAM to an EUV resist will result in an absorption of out-of-band radiation, and, in particular, of DUV radiation, the PAG in the modified resist will not be activated to generate acid as a result of DUV radiation, thus advantageously leading to a substantial reduction, by about 90% to about 100% in the bulk of the resist, of flare effects from DUV radiation for EUV lithography.

Figure 1:
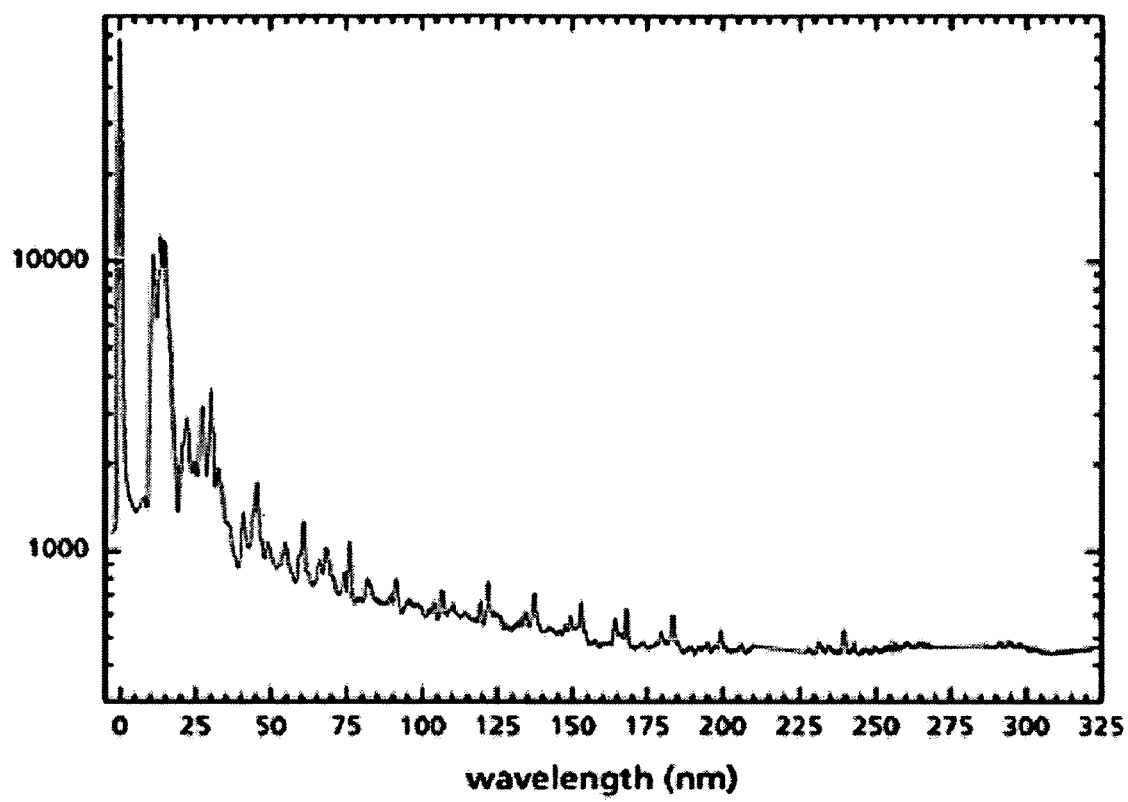
FIG. 1 is a graph plotting an output of an EUV light source versus wavelength.

A selection of a LAM to be incorporated into an EUV photoresist may be based among others on an optimization of the LAM absorbance with respect to a wavelength range of the out-of-band radiation to be absorbed. For example, anthracene (see FIG. 2A) has a high absorbance at a range between about 220 nm and about 260 nm, that is, the amount of light between in the stated wavelength range absorbed by anthracene is orders of magnitude higher than, for example, by benzene (PHS). As a result of the above, a functionalized anthracene LAM would be ideal for absorbing most out-of-band radiation in the DUV range. On the other hand, 6,13 pentacenequinone (FIG. 2B) would be ideal for absorbing out-of-band radiation at wavelengths in the range between about 300 nm to about 400 nm. It is noted, however, that embodiments of the present invention encompass within their scope the optimization of LAM selection for EUV lithography based on out-of-band radiation in any wavelength range, and not limited to the wavelength ranges shown for example in FIG. 1.

Advantageously, embodiments of the present invention lead to a reduction of the sensitivity of EUV photoresists to out-of-band radiation, and in particular to a substantial elimination of a sensitivity of EUV photoresists to out-of-band radiation in a particular wavelength range that is a function of the LAM. In addition, to the extent that embodiments of the present invention involve the selection of LAMs that do not affect or even reduce an absorbance of the EUV resists into which they are incorporated, embodiments of the present invention do not compromise a performance of EUV resists. Moreover, the selection of aromatic LAMs advantageously further improves an etch resistance of the EUV resists into which the LAMs are incorporated. Accordingly, embodiments of the present invention advantageously obviate the need for a spectral purity filter while improving the EUV etching process.

Formulated EUV photoresists typically utilize predominantly a polymer as the resin, a PAG, and, optionally, small quantities of other species. Polymer resins used in EUV resists may include polymers in the polystyrene group and/or in the polyhydroxystyrene group. Other examples for the resins include ESCAP, acrylate, silicon-containing resins, such as poly-silane, or molecular glasses in place of polymer.

According to embodiments of the present invention, an incorporation of a LAM into an EUV resist may be effected by closely matching surface energies of the selected LAM and of the EUV resist, and by selecting the LAM and the EUV resist to have similar functional groups in order to facilitate the blending. A LAM according to embodiments of the present invention may, for example, be incorporated into the EUV resist using any one of conventional blending techniques.

Figure 4:
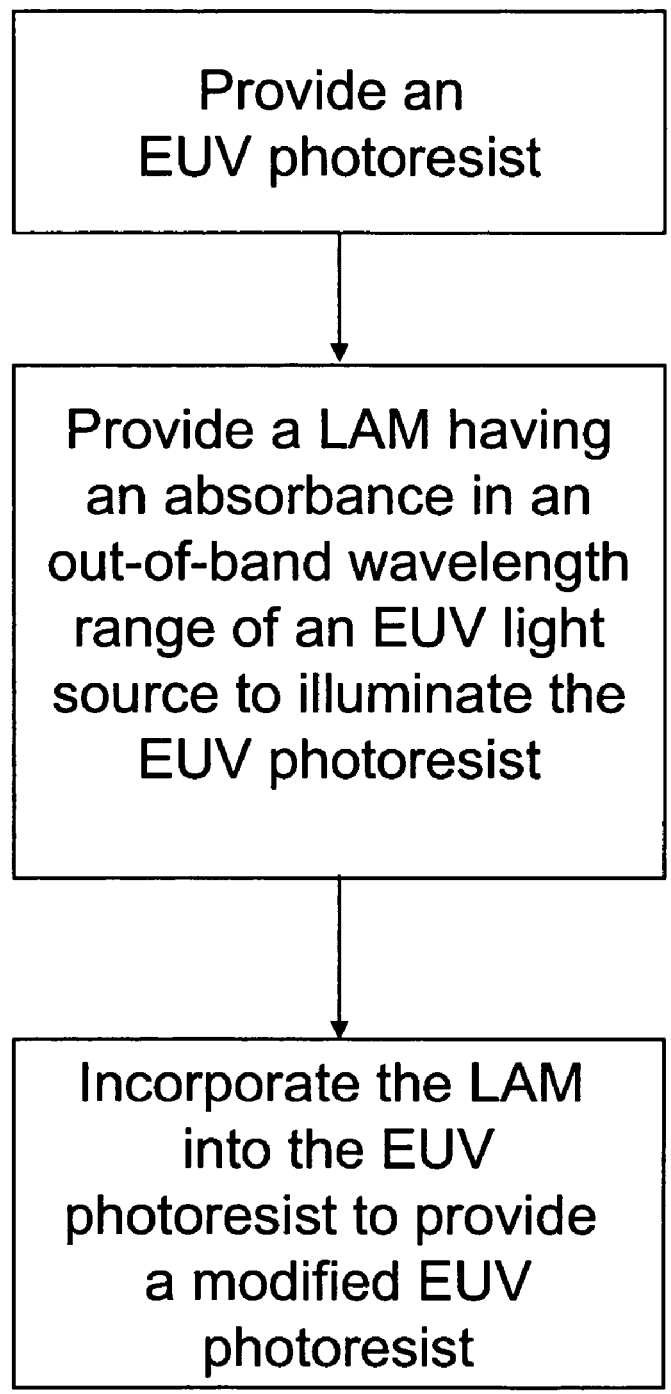
FIG. 4 is a block diagram depicting a method of forming a modified EUV photoresist according to embodiments of the present invention.

Referring next to FIG. 4, a block diagram is provided depicting a method according to embodiments of the present invention. As shown in FIG. 4, a method according to an embodiment of the present invention includes, at block 101, providing an EUV photoresist; at t block 102, providing a LAM having an absorbance in an out-of-band wavelength range of an EUV light source to illuminate the EUV photoresist; and at block 103, incorporating the LAM into the EUV photoresist to provide a modified EUV photoresist.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method of making a modified EUV photoresist comprising:
   providing an EUV photoresist;
   providing a light absorbance material (LAM); and
   incorporating the LAM into the EUV photoresist to make the modified EUV photoresist, wherein:
   the LAM has an absorbance to out-of-band radiation in a wavelength range of an EUV source selected to illuminate the modified EUV photoresist; and
   the modified EUV photoresist has a bulk sensitivity to out-of-band radiation of the EUV source that is reduced with respect to a bulk sensitivity to out-of-band radiation of the EUV photoresist prior to incorporating.

2. The method of claim 1, wherein the bulk sensitivity to out-of band radiation is reduced by about 90% to about 100% with respect to a bulk sensitivity of the EUV photoresist to out-of-band radiation prior to incorporating.

3. The method of claim 1, wherein the molar amount of LAM in the EUV photoresist is between about 5% to about 15% of total solids.

4. The method of claim 1, wherein the LAM has an aromatic structure.

5. The mixture of claim 4, wherein the LAM includes 6, 13-pentacenequinone.

6. The method of claim 1 wherein incorporating comprises blending the LAM into the EUV photoresist.

7. The method of claim 1, wherein the LAM has a DUV absorbance larger than about $2\ \mu m^{-1}$, and an EUV absorbance less than about $1\ \mu m^{-1}$.

8. The method of claim 1, wherein LAM has a maximum oxygen content of about 25%.

9. The method of claim 1, wherein the LAM contains at least one element that decreases absorbance with respect to EUV radiation.

10. The method of claim 9, wherein the LAM contains at least one of silicon, hydrogen and carbon.

11. The method of claim 1, wherein elements adapted to increase absorbance with respect to EUV radiation are present in the LAM at a substantially identical concentration, or at a lower concentration, than in the EUV photoresist.

12. The method of claim 1, further comprising selecting the EUV photoresist and the LAM to have surface energies that are substantially matched.

13. A modified EUV photoresist comprising:
   an EUV photoresist; and
   a LAM incorporated into the EUV photoresist to make the modified EUV photoresist wherein:

the LAM has an absorbance in an out-of-band wavelength range of an EUV source selected to illuminate the modified EUV photoresist; and the modified EUV photoresist has a bulk sensitivity to out-of-band radiation of the EUV source that is lower with respect to a bulk sensitivity to out-of-band radiation of an EUV photoresist without the LAM.

14. The photoresist of claim 13, wherein the bulk sensitivity is lower by about 90% to about 100% with respect to a bulk sensitivity of the EUV photoresist without the LAM.

15. The photoresist of claim 13, wherein the molar amount of LAM in the EUV photoresist is between about 5% to about 15% of total solids.

16. The photoresist of claim 13, wherein the LAM has an aromatic structure.

17. The mixture of claim 16, wherein the LAM includes 6,13-pentacenequinone.

18. The photoresist of claim 13, comprising a blend of the LAM and the EUV photoresist.

19. The photoresist of claim 13, wherein the LAM has a DUV absorbance larger than about 2 µm$^{-1}$ and an EUV absorbance less than about 1 µm$^{-}$.

20. The photoresist of claim 13, wherein LAM has a maximum oxygen content of about 25%.

21. The photoresist of claim 13, wherein the LAM contains at least one element that decreases absorbance with respect to EUV radiation.

22. The photoresist of claim 21, wherein the LAM contains at least one of silicon, hydrogen and carbon.

23. A mixture comprising:
a composition including:
a resin having photoacid-labile groups; and
at least one photoacid generator compound; and
a LAM blended into the composition to yield a modified composition, wherein:
the LAM has an absorbance in an out-of-band wavelength range of an EUV source selected to illuminate the modified composition; and
the modified composition has a bulk sensitivity to out-of-band radiation of the EUV source that is lower with respect to a bulk sensitivity to out-of-band radiation of an composition without the LAM.

24. The mixture of claim 23, wherein the LAM has an aromatic structure.

25. The mixture of claim 24, wherein the LAM includes 6,13-pentacenequinone.

26. The mixture of claim 23, wherein the resin includes at least one polymer in at least one of the polystyrene group and the polyhydroxystyrene group.

27. The mixture of claim 24, wherein the at least one photoacid generator compound includes one of an ionic photoacid generator compound and a non-ionic photoacid generator compound.

* * * * *